United States Patent
Song

(10) Patent No.: US 10,573,242 B2
(45) Date of Patent: Feb. 25, 2020

(54) DISPLAY DEVICE AND PIXEL COMPENSATION METHOD

(71) Applicant: BOE Technology Group Co., Ltd., Beijing (CN)

(72) Inventor: Danna Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/822,495

(22) Filed: Nov. 27, 2017

(65) Prior Publication Data

US 2018/0330666 A1    Nov. 15, 2018

(30) Foreign Application Priority Data

May 12, 2017    (CN) .......................... 2017 1 0334616

(51) Int. Cl.
| | |
|---|---|
| *G09G 3/3258* | (2016.01) |
| *H01L 27/12* | (2006.01) |
| *G09G 3/3233* | (2016.01) |
| *G09G 3/3291* | (2016.01) |
| *H01L 27/32* | (2006.01) |

(52) U.S. Cl.
CPC ......... *G09G 3/3258* (2013.01); *G09G 3/3233* (2013.01); *G09G 3/3291* (2013.01); *H01L 27/1214* (2013.01); *G09G 2310/0264* (2013.01); *G09G 2320/0295* (2013.01); *G09G 2320/045* (2013.01); *H01L 27/3213* (2013.01)

(58) Field of Classification Search
CPC ... G09G 2310/0264; G09G 2320/0295; G09G 2320/045; G09G 3/3233; G09G 3/3258; G09G 3/3291; H01L 27/1214; H01L 27/3213

See application file for complete search history.

(56) References Cited

U.S. PATENT DOCUMENTS

| | | | | |
|---|---|---|---|---|
| 2007/0040770 | A1* | 2/2007 | Kim | G09G 3/3233 345/76 |
| 2009/0267965 | A1 | 10/2009 | Han | |
| 2016/0365032 | A1* | 12/2016 | Wu | G09G 3/3258 |
| 2017/0132977 | A1* | 5/2017 | Kim | G09G 3/3225 |
| 2017/0169767 | A1* | 6/2017 | Song | G09G 3/3241 |
| 2017/0229089 | A1* | 8/2017 | Song | G09G 3/00 |

FOREIGN PATENT DOCUMENTS

| | | |
|---|---|---|
| CN | 1917015 A | 2/2007 |
| CN | 104809986 A | 7/2015 |
| CN | 106504705 A | 3/2017 |
| KR | 10-2006-0038845 A | 5/2006 |

OTHER PUBLICATIONS

First Office Action, including Search Report, for Chinese Patent Application No. 201710334616.6, dated Nov. 6, 2018, 17 pages.

* cited by examiner

*Primary Examiner* — Dmitriy Bolotin
(74) *Attorney, Agent, or Firm* — Westman, Champlin & Koehler, P.A.

(57) ABSTRACT

The present disclosure provides a display device and a pixel compensation method. The display device includes a display panel and a driver circuit. The display panel includes a plurality of pixel units, and any two subpixels of each pixel unit are connected to the driver circuit through a compensation circuit. The driver circuit is configured to acquire a compensation voltage of each subpixel through the compensation circuit, and compensate for a voltage applied to the subpixel in accordance with the compensation voltage.

16 Claims, 3 Drawing Sheets

DISPLAY DEVICE AND PIXEL COMPENSATION METHOD

CROSS-REFERENCE TO RELATED APPLICATION

The present application claims a priority of the Chinese patent application No. 201710334616.6 filed on May 12, 2017, which is incorporated herein by reference in its entirety.

TECHNICAL FIELD

The present disclosure relates to the field of display technology, in particular to a display device and a pixel compensation method.

BACKGROUND

As a self-luminescence element, an active matrix/organic light-emitting diode (AMOLED) is based on an OLED which is capable of emitting light due to injection and recombination of carriers occurring for an organic semiconductor material and a light-emitting material under the effect of an electric field. Due to such advantages as high brightness, high image quality, very small thickness and excellent display performance, the AMOLED tends to be widely used.

However, due to the limitation of manufacture process, the drift of a threshold voltage Vth may occur for a driving thin film transistor (TFT) of each subpixel. As a result, currents flowing through the OLEDs of the subpixels may be different from each other, and thereby a brightness difference may occur between the subpixels.

SUMMARY

In one aspect, the present disclosure provides in some embodiments a display device, including a display panel and a driver circuit. The display panel includes a plurality of pixel units, and any two subpixels of each pixel unit are connected to the driver circuit through a compensation circuit. The driver circuit is configured to acquire a compensation voltage of each subpixel through the compensation circuit, and compensate for a voltage applied to the subpixel in accordance with the compensation voltage.

In a possible embodiment of the present disclosure, the driver circuit includes a plurality of driving circuit, each driving circuit is configured to drive a corresponding subpixel to display, and any two subpixels of each pixel unit are connected to the corresponding two driving circuits through one compensation circuit.

In a possible embodiment of the present disclosure, all the subpixels of each pixel unit share an identical detection line. The compensation circuit includes five TFTs, an analog-digital converter and a compensation storage capacitor. Gate electrodes of the five TFTs are connected to different power sources. The five TFTs include a first TFT, a second TFT, a third TFT, a fourth TFT and a fifth TFT. Any two subpixels of each pixel unit are connected to a first driving circuit and a second driving circuit respectively. The first driving circuit is connected to a source electrode of the first TFT and a source electrode of the second TFT, a drain electrode of the first TFT is connected to a data line corresponding to one of the subpixels, the second driving circuit is connected to a source electrode of the third TFT and a source electrode of the fourth TFT, and a drain electrode of the fourth TFT is connected to a data line corresponding to the other one of the subpixels. An input end of the analog-digital converter is connected to a source electrode of the fifth TFT, a drain electrode of the fifth TFT is connected to a detection line, a drain electrode of the second TFT, a drain electrode of the third TFT and one end of the compensation storage capacitor, the other end of the compensation storage capacitor is grounded, and an output end of the analog-digital converter is connected to an external counter control register circuit.

In a possible embodiment of the present disclosure, each subpixel includes an OLED, a pixel storage capacitor, an induction capacitor, a sixth TFT, a seventh TFT and an eighth TFT. The pixel storage capacitor is connected between a source electrode and a gate electrode of the sixth TFT, a drain electrode of the seventh TFT is connected to a data line corresponding to the subpixel, the induction capacitor is connected between a gate electrode of the eighth TFT and the ground, a drain electrode of the sixth TFT is connected to a reference voltage source, a source electrode of the sixth TFT is connected to the OLED, a gate electrode of the seventh TFT and the gate electrode of the eighth TFT are connected to different voltage sources, and a source electrode of the eighth TFT is connected to the detection line.

In a possible embodiment of the present disclosure, each pixel unit includes a first subpixel, a second subpixel, a third subpixel and a fourth subpixel, and the second subpixel and the third subpixel of each pixel unit are connected to the corresponding driving circuits through the compensation circuit. The driver circuit is configured to: at an initial stage, turn off the five TFTs, and in the case that a to-be-compensated subpixel is the first subpixel, apply a first predetermined voltage to a data line corresponding to the first subpixel through the driving circuit corresponding to the first subpixel; turn on the second TFT so as to apply an initial voltage to the detection line through the driving circuit corresponding to the second subpixel, or turn on the third TFT so as to apply a second predetermined voltage to the detection line through the driving circuit corresponding to the third subpixel; turn on the first TFT and the fourth TFT, and apply the second predetermined voltage to data lines corresponding to the second subpixel, the third subpixel and the fourth subpixel through the driving circuits corresponding to the second subpixel, the third subpixel and the fourth subpixel; and turn off the second TFT or the third TFT that has been turned on so as to enable the sixth TFT of the first subpixel to charge the detection line until the voltage across the detection line does not increase, and store the voltage across of the detection line in the compensation storage capacitor as the initial voltage.

In a possible embodiment of the present disclosure, the pixel unit includes a first subpixel, a second subpixel, a third subpixel and a fourth subpixel, and the second subpixel and the third subpixel of each subpixel unit are connected to the corresponding driving circuits through the compensation circuit. The driver circuit is configured to: at an initial stage, turn off the five TFTs, and in the case that a to-be-compensated subpixel is the second subpixel, turn on the first TFT so as to apply a first predetermined voltage to a data line corresponding to the second subpixel through the driving circuit corresponding to the second subpixel; turn on the third TFT so as to apply a second predetermined voltage to the detection line through the driving circuit corresponding to the third subpixel; turn on the fourth TFT, so as to apply the second predetermined voltage to data lines corresponding to the first subpixel, the third subpixel and the fourth subpixel through the driving circuits corresponding to the first subpixel, the third subpixel and the fourth subpixel; and turn off the third TFT that has been turned on so as to charge the detection line through the sixth TFT of the second subpixel until a voltage across the detection line does not increase, and store the voltage across the detection line in the compensation storage capacitor as an initial voltage.

In a possible embodiment of the present disclosure, the driver circuit is further configured to turn on the fifth TFT, so as to apply the initial voltage stored in the compensation storage capacitor to the external counter control register circuit through the analog-digital converter.

In a possible embodiment of the present disclosure, the driver circuit is further configured to: at a detection stage, turn off the five TFTs, and in the case that the to-be-compensated subpixel is the first subpixel, apply the first predetermined voltage to the data line corresponding to the first subpixel through the driving circuit corresponding to the first subpixel; turn on the second TFT so as to apply the initial voltage to the detection line through the driving circuit corresponding to the second subpixel, or turn on the third TFT so as to apply a voltage equal to a difference between the first predetermined voltage and the initial voltage to the detection line through the driving circuit corresponding to the third subpixel; turn on the first TFT and the fourth TFT so as to apply the second predetermined voltage to the data lines corresponding to the second subpixel, the third subpixel and the fourth subpixel through the driving circuits corresponding to the second subpixel, the third subpixel and the fourth subpixel; and turn off the second TFT or the third TFT that has been turned on so as to charge the detection line through the sixth TFT of the first subpixel until the voltage across the detection line does not increase, and store the voltage across the detection line in the compensation storage capacitor as a target voltage.

In a possible embodiment of the present disclosure, the driver circuit is further configured to: at a detection stage, turn off the five TFTs, and in the case that the to-be-compensated subpixel is the second subpixel, turn on the first TFT so as to apply the first predetermined voltage to the data line corresponding to the second subpixel through the driving circuit corresponding to the second subpixel; turn on the third TFT so as to apply the initial voltage to the detection line through the driving circuit corresponding to the third subpixel; turn on the fourth TFT so as to apply the second predetermined voltage to the data lines corresponding to the first subpixel, the third subpixel and the fourth subpixel through the driving circuits corresponding to the first subpixel, the third subpixel and the fourth subpixel; and turn off the third TFT that has been turned on so as to charge the detection line through the sixth TFT of the second subpixel until the voltage across the detection line does not increase, and store the voltage across the detection line in the compensation storage capacitor as a target voltage.

In a possible embodiment of the present disclosure, the driver circuit is further configured to turn on the fifth TFT so as to apply the target voltage stored in the compensation storage capacitor to the external counter control register circuit through the analog-digital converter.

In a possible embodiment of the present disclosure, the driver circuit is further configured to receive the compensation voltage calculated by the external counter control register circuit, and compensate for the voltage applied to the to-be-compensated subpixel in accordance with the compensation voltage. The compensation voltage is calculated by the external counter control register circuit in accordance with the initial voltage and the target voltage.

In another aspect, the present disclosure provides in some embodiments a pixel compensation method for use in a display device. The display device includes a display panel and a driver circuit. The display panel includes a plurality of pixel units, and any two subpixels of each pixel unit are connected to the driver circuit through a compensation circuit. The pixel compensation method includes a step of acquiring a compensation voltage of each subpixel through the compensation circuit, and compensating for a voltage applied to the subpixel in accordance with the compensation voltage.

In a possible embodiment of the present disclosure, the driver circuit includes a plurality of driving circuit, each driving circuit is configured to drive a corresponding subpixel to display, and any two subpixels of each pixel unit are connected to the corresponding two driving circuits through one compensation circuit.

In a possible embodiment of the present disclosure, all the subpixels of each pixel unit share an identical detection line. The compensation circuit includes five TFTs, an analog-digital converter and a compensation storage capacitor. Gate electrodes of the five TFTs are connected to different power sources. The five TFTs include a first TFT, a second TFT, a third TFT, a fourth TFT and a fifth TFT. Any two subpixels of each pixel unit are connected to a first driving circuit and a second driving circuit respectively. The first driving circuit is connected to a source electrode of the first TFT and a source electrode of the second TFT, a drain electrode of the first TFT is connected to a data line corresponding to one of the subpixels, the second driving circuit is connected to a source electrode of the third TFT and a source electrode of the fourth TFT, and a drain electrode of the fourth TFT is connected to a data line corresponding to the other one of the subpixels. An input end of the analog-digital converter is connected to a source electrode of the fifth TFT, a drain electrode of the fifth TFT is connected to a detection line, a drain electrode of the second TFT, a drain electrode of the third TFT and one end of the compensation storage capacitor, the other end of the compensation storage capacitor is grounded, and an output end of the analog-digital converter is connected to an external counter control register circuit.

In a possible embodiment of the present disclosure, each subpixel includes an OLED, a pixel storage capacitor, an induction capacitor, a sixth TFT, a seventh TFT and an eighth TFT. The pixel storage capacitor is connected between a source electrode and a gate electrode of the sixth TFT, a drain electrode of the seventh TFT is connected to a data line corresponding to the subpixel, the induction capacitor is connected between a gate electrode of the eighth TFT and the ground, a drain electrode of the sixth TFT is connected to a reference voltage source, a source electrode of the sixth TFT is connected to the OLED, a gate electrode of the seventh TFT and the gate electrode of the eighth TFT are connected to different voltage sources, and a source electrode of the eighth TFT is connected to the detection line.

BRIEF DESCRIPTION OF THE DRAWINGS

In order to illustrate the technical solutions of the present disclosure or the related art in a clearer manner, the drawings desired for the present disclosure or the related art will be described hereinafter briefly. Apparently, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments.

Figure 1:
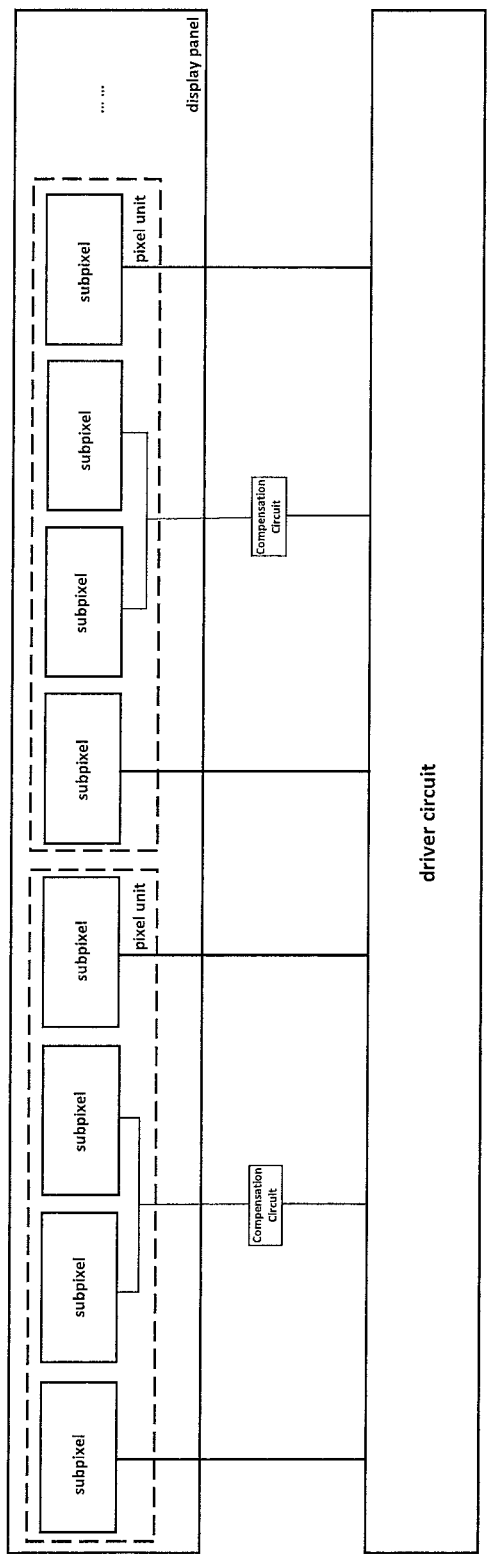
FIG. 1 is a block diagram of a display device according to one embodiment of the present disclosure.

As shown in FIG. 1, the present disclosure provides in some embodiments a display device which mainly includes a display panel and a driver circuit (driver IC). The display panel includes a plurality of pixel units and each pixel unit includes a plurality of subpixels.

In the embodiments of the present disclosure, the display device is added with a compensation circuit. Any two subpixels of each pixel unit are connected to the driver circuit through a compensation circuit. The driver circuit is configured to acquire a compensation voltage of each subpixel through the compensation circuit, and compensate for a voltage applied to the subpixel in accordance with the compensation voltage.

The driver circuit may include a plurality of driving circuits corresponding to the subpixels of the pixel units respectively, and one driving circuit may be configured to drive one subpixel to display. Any two subpixels of each pixel unit are connected to the corresponding two driving circuits through one compensation circuit.

In a possible embodiment of the present disclosure, in the display device, all the subpixels of each pixel unit share one identical detection line. The compensation circuit includes five TFTs, an analog-digital converter and a compensation storage capacitor. Gate electrodes of the five TFTs are connected to different power sources. The five TFTs include a first TFT, a second TFT, a third TFT, a fourth TFT and a fifth TFT.

In a possible embodiment of the present disclosure, any two subpixels of each pixel unit are connected to a first driving circuit and a second driving circuit respectively.

Two subpixels in the middle of each pixel unit are connected to the first driving circuit and the second driving circuit through the compensation circuit. Of course, in the actual use, any two other subpixels of each pixel unit, e.g., the two subpixels at edges of each pixel unit, may be connected to the corresponding driving circuits through the compensation circuit, which will not be particularly defined herein.

Figure 2:
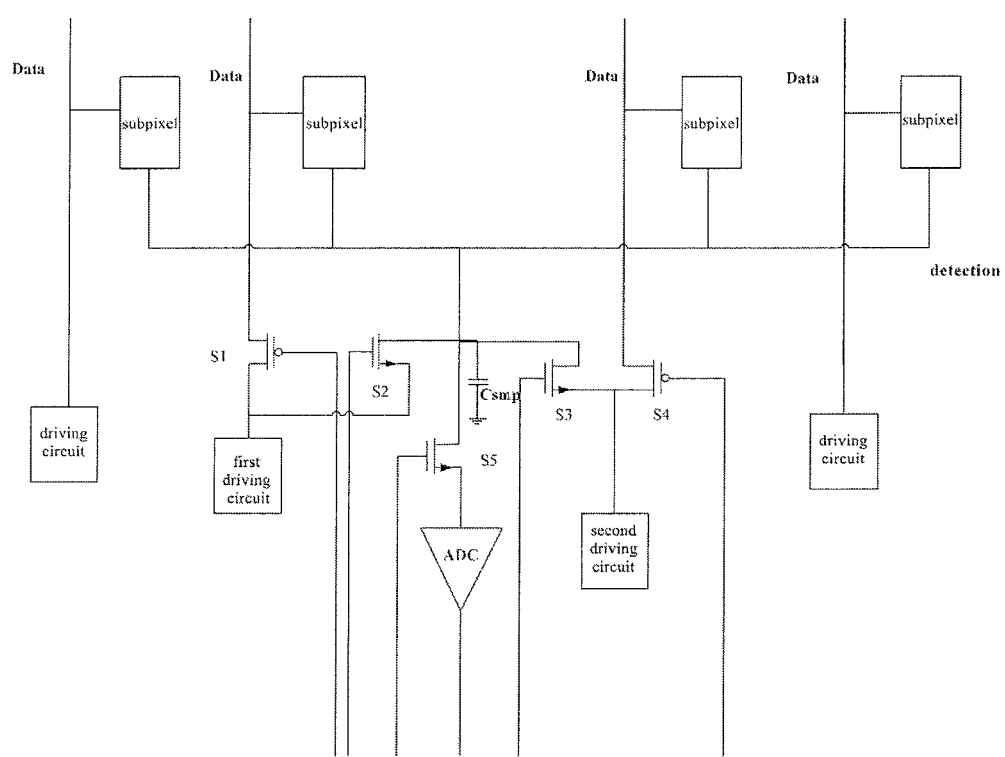
FIG. 2 is a schematic view showing a compensation circuit according to one embodiment of the present disclosure.

FIG. 2 shows the compensation circuit of one pixel unit. As shown in FIG. 2, the two subpixels in the middle of the pixel unit are connected to the first driving circuit and the second driving circuit through the compensation circuit respectively. The pixel unit includes, from left to right, a first subpixel, a second subpixel, a third subpixel and a fourth subpixel. Of course, the pixel unit in FIG. 2 is merely for illustrative purposes, and a person skilled in the art may make any appropriate modification or alteration on the basis of FIG. 2.

As shown in FIG. 2, S1, S2, S3, S4 and S5 represent the first TFT, the second TFT, the third TFT, the fourth TFT and the fifth TFT respectively, ADC represents the analog-digital converter, and Csmp represents the compensation storage capacitor.

The first driving circuit is connected to a source electrode of the first TFT S1 and a source electrode of the second TFT S2, a drain electrode of the first TFT S1 is connected to a data line corresponding to the second subpixel, the second driving circuit is connected to a source electrode of the third TFT S3 and a source electrode of the fourth TFT S4, and a drain electrode of the fourth TFT S4 is connected to a data line corresponding to the third subpixel.

An input end of ADC is connected to a source electrode of the fifth TFT S5, a drain electrode of the fifth TFT S5 is connected to the detection line, a drain electrode of the second TFT S2, a drain electrode of the third TFT S3 and one end of Csmp. And the other end of Csmp is grounded. In actual use, an output end of ADC may be connected to an external counter control register circuit.

Figure 3:
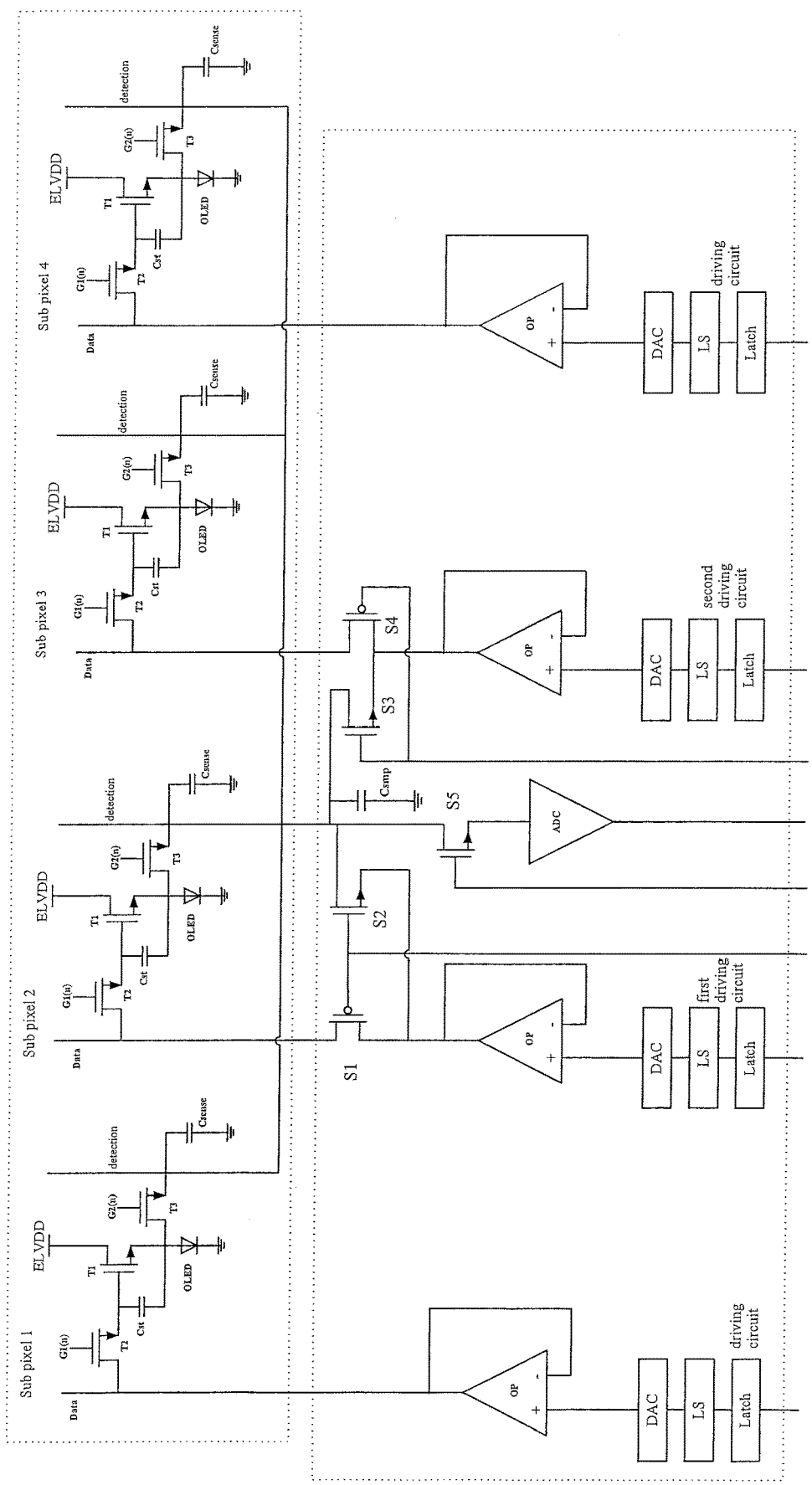
FIG. 3 is a schematic view showing an AMOLED compensation circuit according to one embodiment of the present disclosure.

A pixel compensation procedure will be described hereinafter in conjunction with an AMOLED compensation circuit as shown in FIG. 3.

As shown in FIG. 3, each pixel unit of the display panel may include a first subpixel indicated by "Subpixel1", a second subpixel indicated by "Subpixel2", a third subpixel indicated by "Subpixel3" and a fourth subpixel indicated by "Subpixel4". In a possible embodiment of the present disclosure, for a subpixel structure inside the display panel, the four subpixels may share one identical detection line. The driver circuit includes a plurality of driving circuits, and the subpixels of the display panel are connected to the driving circuits through data lines respectively.

It should be appreciated that, the display device in the embodiments of the present disclosure may be applied to the display panels with different color modes. These display panels with different color modes may include different numbers of subpixels. For example, for the display panel with a red-green-blue (RGB) mode, each pixel unit may include three (3) subpixels, and for the display panel with a red-green-blue-white (RGBW) mode, each pixel unit may include four (4) subpixels.

In the case of displaying an image by the display device, a voltage representing a brightness value may be applied by the driver circuit to each subpixel, so as to generate a current flowing through a driving TFT, thereby to drive an OLED to emit light at a target brightness value.

Each subpixel of the display panel is provided with a light-emitting element, e.g., the OLED in FIG. 3. However, with the elapse of time, the light-emitting element in each subpixel may be aged and its luminous efficiency may degrade gradually. Due to different aging degrees of the light-emitting elements, conversion efficiency for the OLEDs may be different from each other, and thereby the brightness non-uniformity may occur for the display panel.

In order to improve the brightness uniformity for the display panel, an external compensation scheme may be adopted. At first, a drift value of a threshold voltage Vth of the driving TFT may be calculated, and then the voltage applied to each subpixel may be compensated in accordance with the drift value, so as to enable the light-emitting elements of the entire display panel to emit light at an identical brightness value.

For the driver circuit in the embodiments of the present disclosure, the gate electrodes of the five TFTs of the compensation circuit are connected to different voltage sources respectively, so as to turn on or off the TFTs through the voltage sources, control a current flow direction in the display panel, detect an initial voltage, detect a target voltage for each subpixel in accordance with the initial voltage, and acquire the compensation voltage in accordance with the target voltage, thereby to compensate for the brightness of the subpixel.

As shown in FIG. 3, each driving circuit includes an operational amplifier (OP). In FIG. 3, any two subpixels of each pixel unit are connected to a first driving circuit and a second driving circuit respectively. The first driving circuit includes a first operational amplifier OP1, and the second driving circuit includes a second operational amplifier OP2. Each driving circuit further includes a latch unit Latch, a delay unit LS, and a digital-analog converter DAC. The latch unit Latch is connected to the delay unit LS, the delay unit LS is connected to the digital-analog converter DAC, the digital-analog converter DAC is connected to a positive input end of the operational amplifier, and a negative input end of the operational amplifier is connected to an output end of the operational amplifier. Of course, during the implementation, circuit units of the driving circuit may be adjusted in accordance with the practical need, which will not be particularly defined herein.

The first driving circuit is connected to a source electrode of the first TFT S1 and a source electrode of the second TFT S2, a drain electrode of the first TFT S1 is connected to a corresponding data line, an output end of the first driving circuit is connected to a source electrode of the second TFT S2 and a source electrode of the fourth TFT S4, and a drain electrode of the fourth TFT S4 is connected to a corresponding data line.

An input end of the ADC is connected to a source electrode of the fifth TFT S5, a drain electrode of the fifth TFT S5 is connected to the detection line, a drain electrode of the second TFT S2, a drain electrode of the third TFT S3 and one end of the compensation storage capacitor Csmp. The other end of the compensation storage capacitor Csmp is grounded, and an output end of the ADC is connected to the external counter control register circuit TCON.

As shown in FIG. 3, each subpixel includes an OLED, a pixel storage capacitor Cst, an induction capacitor Csense, a sixth TFT T1, a seventh TFT T2 and an eighth TFT T3. The pixel storage capacitor Cst is connected between a source electrode and a gate electrode of the sixth TFT T1, the induction capacitor Csense is connected between a gate electrode of the eighth TFT T3 and the ground, a drain electrode of the sixth TFT T1 is connected to a reference voltage source ELVDD, the source electrode of the sixth TFT T1 is connected to one end of the OLED, and the other end of the OLED is grounded. In addition, the seventh TFT T2 and the eighth TFT T3 are connected to voltage sources G1(n) and G2(n) respectively. A source electrode of the eighth TFT T3 is connected to the detection line. It should be appreciated that, the sixth TFT T1 is a driving TFT, and the seventh TFT T2 and the eighth TFT T3 are switching TFTs.

The pixel compensation procedure may mainly include three stages, i.e., an initial stage where an initial voltage is acquired, a detection stage where a target voltage is acquired in accordance with the initial voltage, and a compensation stage where compensation data is calculated in accordance with the target voltage and fed back to a corresponding subpixel for compensation.

In the embodiments of the present disclosure, each pixel unit includes four subpixels, two of which are connected to the driving circuits respectively through the compensation circuit. For example, two subpixels in the middle of the pixel unit may be connected to the first driving circuit and the second driving circuit through the compensation circuit respectively. In the case that the pixel compensation needs to be performed and the initial voltage and the target voltage are detected at the initial stage and the detection stage, the two subpixels connected to the driving circuits through the compensation circuit may be detected in a similar manner, while the two subpixels not connected to the driving circuits through the compensation circuit may be detected in another similar manner.

In the case that two subpixels in the middle of each pixel unit are connected to the first driving circuit and the second driving circuit through the compensation circuit respectively, the pixel compensation procedure for the subpixels of the pixel unit will be described hereinafter.

At the initial stage, the acquisition of the initial voltages is slightly different from each other for the subpixels at different positions.

To be specific, in the case that each pixel unit includes a first subpixel, a second subpixel, a third subpixel and a fourth subpixel, and the second subpixel and the third subpixel are connected to the driving circuits through the compensation circuit respectively, the initial voltage of the first subpixel may be acquired as follows.

At the initial stage, the five TFTs are turned off, and in the case that a to-be-compensated subpixel is the first subpixel, a first predetermined voltage is applied to a data line corresponding to the first subpixel through the driving circuit corresponding to the first subpixel.

Next, the second TFT is turned on so as to apply the initial voltage to the detection line through the driving circuit corresponding to the second subpixel, or the third TFT is turned on so as to apply a second predetermined voltage to the detection line through the driving circuit corresponding to the third subpixel.

Next, the first TFT and the fourth TFT are turned on, so as to apply the second predetermined voltage to the data lines corresponding to the second subpixel, the third subpixel and the fourth subpixel through the driving circuits corresponding to the second subpixel, the third subpixel and the fourth subpixel respectively.

Finally, the second TFT or the third TFT that has been turned on is turned off so as to charge the detection line through the sixth TFT of the first subpixel until a voltage across the detection line does not increase, and then the voltage across the detection line is stored in the compensation storage capacitor as the initial voltage.

In addition, in the case that each pixel unit includes the first subpixel, the second subpixel, the third subpixel and the fourth subpixel, and the second subpixel and the third subpixel are connected to the driving circuits through the compensation circuit respectively, the initial voltage of the second subpixel may be acquired as follows.

At the initial stage, the five TFTS are turned off, and in the case that the to-be-compensated subpixel is the second subpixel, the first TFT is turned on so as to apply the first predetermined voltage to the data line corresponding to the second subpixel through the driving circuit corresponding to the second subpixel.

Next, the third TFT is turned on, so as to apply the second predetermined voltage to the detection line through the driving circuit corresponding to the third subpixel.

Next, the fourth TFT is turned on, so as to apply the second predetermined voltage to the data lines corresponding to the first subpixel, the third subpixel and the fourth subpixel through the driving circuits corresponding to the first subpixel, the third subpixel and the fourth subpixel respectively.

Finally, the third TFT that has been turned on is turned off so as to charge the detection line through the first TFT of the second subpixel until the voltage across the detection line does not increase, and then the voltage across the detection line is stored in the compensation storage capacitor as the initial voltage.

In addition, in the case that each pixel unit includes the first subpixel, the second subpixel, the third subpixel and the fourth subpixel, and the second subpixel and the third subpixel are connected to the driving circuits through the compensation circuit respectively, the initial voltage of the third subpixel may be acquired as follows.

At the initial stage, the five TFTs are turned off, and in the case that the to-be-compensated subpixel is the third subpixel, the fourth TFT is turned on, so as to apply the first predetermined voltage to the data line corresponding to the third subpixel through the driving circuit corresponding to the third subpixel.

Next, the second TFT is turned on, so as to apply the second predetermined voltage to the detection line through the driving circuit corresponding to the second subpixel.

Next, the first TFT is turned on, so as to apply the second predetermined voltage to the data lines corresponding to the first subpixel, the second subpixel and the fourth subpixel through the driving circuits corresponding to the first subpixel, the second subpixel and the fourth subpixel respectively.

Finally, the second TFT that has been turned on is turned off so as to charge the detection line through the first TFT of the third subpixel until the voltage across the detection line does not increase, and then the voltage across the detection line is stored in the compensation storage capacitor as the initial voltage.

In the case that each pixel unit includes the first subpixel, the second subpixel, the third subpixel and the fourth subpixel, and the second subpixel and the third subpixel are connected to the driving circuits through the compensation circuit respectively, the initial voltage of the fourth subpixel may be acquired as follows.

At the initial stage, the five TFTs are turned off, and in the case that the to-be-compensated subpixel is the fourth subpixel, the first predetermined voltage is applied to the data line corresponding to the fourth subpixel through the driving circuit corresponding to the fourth subpixel.

Next, the second TFT is turned on so as to apply the second predetermined voltage to the detection line through the driving circuit corresponding to the second subpixel, or the third TFT is turned on so as to apply the second predetermined voltage to the detection line through the driving circuit corresponding to the third subpixel.

Next, the first TFT and the fourth TFT are turn on, so as to apply the second predetermined voltage to the data lines corresponding to the first subpixel, the second subpixel and the third subpixel through the driving circuits corresponding to the first subpixel, the second subpixel and the third subpixel respectively.

Finally, the second TFT or the third TFT is turned off so as to charge the detection line through the first TFT of the fourth subpixel until the voltage across the detection line does not increase, and then the voltage across the detection line is stored in the compensation storage capacitor as the initial voltage.

In the embodiments of the present disclosure, after the acquisition of the initial voltage, the fifth TFT may be further turned on, so as to output the initial voltage stored in the compensation storage capacitor to the external counter control register circuit through the analog-digital converter and store the initial voltage therein.

At the detection stage, based on the above acquisition of the initial voltages, the acquisition of the target voltages may be slightly different from each other for the subpixels at different positions.

To be specific, the target voltage of the first subpixel may be acquired as follows. At the detection stage, the five TFTs are turned off, and in the case that the to-be-compensated subpixel is the first subpixel, the first predetermined voltage is applied to the data line corresponding to the first subpixel through the driving circuit corresponding to the first subpixel.

Next, the second TFT is turned on so as to apply the initial voltage to the detection line through the driving circuit corresponding to the second subpixel, or the third TFT is turned on so as to apply a voltage equal to a difference between the first predetermined voltage and the initial voltage to the detection line through the driving circuit corresponding to the third subpixel.

Next, the first TFT and the fourth TFT are turned on, so as to apply the second predetermined voltage to the data lines corresponding to the second subpixel, the third subpixel and the fourth subpixel through the driving circuits corresponding to the second subpixel, the third subpixel and the fourth subpixel respectively.

Finally, the second TFT or the third TFT that has been turned on is turned off so as to charge the detection line through the sixth TFT of the first subpixel until the voltage across the detection line does not increase, and then the voltage across the detection line is stored in the compensation storage capacitor as the target voltage.

In addition, the target voltage of the second subpixel may be acquired as follows.

At the detection stage, the five TFTs are turned off, and in the case that the to-be-compensated subpixel is the second subpixel, the first predetermined voltage is applied to the data line corresponding to the second subpixel through the driving circuit corresponding to the second subpixel.

Next, the third TFT is turned on, so as to apply the initial voltage to the detection line through the driving circuit corresponding to the third subpixel.

Next, the fourth TFT is turned on, so as to apply the second predetermined voltage to the data lines corresponding to the first subpixel, the third subpixel and the fourth subpixel through the driving circuits corresponding to the first subpixel, the third subpixel and the fourth subpixel respectively.

Finally, the third TFT that has been turned on is turned off so as to charge the detection line through the sixth TFT of the second subpixel until the voltage across the detection line does not increase, and then the voltage across the detection line is stored in the compensation storage capacitor as the target voltage.

In addition, the target voltage of the third subpixel may be acquired as follows.

At the detection stage, the five TFTs are turned off, and in the case that the to-be-compensated subpixel is the third subpixel, the third TFT is turned on, such that the first predetermined voltage is applied to the data line corresponding to the third subpixel through the driving circuit corresponding to the third subpixel.

Next, the second TFT is turned on, so as to apply the initial voltage to the detection line through the driving circuit corresponding to the second subpixel.

Next, the first TFT is turned on, so as to apply the second predetermined voltage to the data lines corresponding to the first subpixel, the second subpixel and the fourth subpixel through the driving circuits corresponding to the first subpixel, the second subpixel and the fourth subpixel respectively.

Finally, the second TFT that has been turned on is turned off so as to charge the detection line through the first TFT of the third subpixel until the voltage across the detection line does not increase, and then the voltage across the detection line is stored in the compensation storage capacitor as the target voltage.

In addition, the target voltage of the fourth subpixel may be acquired as follows.

At the detection stage, the five TFTs are turned off, and in the case that the to-be-compensated subpixel is the fourth subpixel, the first predetermined voltage is applied to the data line corresponding to the fourth subpixel through the driving circuit corresponding to the fourth subpixel.

Next, the second TFT is turned on so as to apply the initial voltage to the detection line through the driving circuit corresponding to the second subpixel, or the third TFT is turned on so as to apply the initial voltage to the detection line through the driving circuit corresponding to the third subpixel.

Next, the first TFT and the fourth TFT are turned on, so as to apply the second predetermined voltage to the data lines corresponding to the first subpixel, the second subpixel and the third subpixel through the driving circuits corresponding to the first subpixel, the second subpixel and the third subpixel respectively.

Finally, the second TFT or the third TFT that has been turned on is turned off so as to charge the detection line through the first TFT of the fourth subpixel until the voltage across the detection line does not increase, and then the voltage across the detection line is stored in the compensation storage capacitor as the target voltage.

At the compensation stage, after the acquisition of the target voltage, the fifth TFT may be turned on, so as to output the target voltage stored in the pixel compensation capacitor to the external counter control register circuit through the analog-digital converter. The external counter control register circuit is configured to calculate the compensation data in accordance with the target voltage, and feed back the compensation data to the corresponding subpixel for compensation.

For ease of understanding, the following description may be given in the case that the to-be-compensated subpixel is the first subpixel.

Referring to FIG. 2 and FIG. 3, at the initial stage, the TFTs S1, S2, S3, S4 and S5 are each in an off state, and a high voltage Vg (i.e., the first predetermined voltage) is applied to the data line corresponding to the first subpixel through the driving circuit corresponding to the first subpixel. Next, the TFT S2 is turned on so as to apply a voltage of 0V (i.e., the second predetermined voltage) to the detection line through the driving circuit corresponding to the second subpixel, or the TFT S3 is turned on so as to apply the voltage of 0V to the detection line through the driving circuit corresponding to the third subpixel.

Next, the TFTs S1 and S4 are turned on, so as to enable the second subpixel and the third subpixel to be electrically connected to the driving circuits respectively. In this regard, the voltages may be applied to the data lines corresponding to the second subpixel and the third subpixel through the driving circuits. In other words, after the TFTs S1 and S4 are turned on, it is able to apply the voltage of 0V to the data lines corresponding to the other subpixels (i.e., the second subpixel, the third subpixel and the fourth subpixel) through the driving circuits corresponding to these subpixels respectively.

Finally, the TFT S2 or S3 that has been turned on is turned off, so as to charge the detection line through the sixth TFT T1 of the first subpixel until the voltage across the detection line does not increase, and then the sixth TFT T1 is turned off. At this time, the voltage across the detection line is supposed to be Vg−Vth, and it is stored in the Csmp of the compensation circuit.

After the initial stage, the voltage Vg−Vth stored in the Csmp is taken as the initial voltage. The fifth TFT S5 is turned on, so as to output this initial voltage to the external counter control register circuit and store it therein.

At the detection stage subsequent to the initial stage, during the real-time detection, a voltage of Vg is applied to the data line corresponding to the first subpixel through the driving circuit corresponding to the first subpixel. Next, the TFT S2 or S3 is turned on, so as to apply a voltage of Vg−Vth1 to the detection line through the driving circuit corresponding to the second subpixel or the third subpixel, where Vg−Vth1 represents the initial voltage stored in the external counter control register circuit. Then, the TFTs S1 and S4 are turned on, so as to apply the voltage of 0V to the data lines corresponding to the second subpixel, the third subpixel and the fourth subpixel through the driving circuits corresponding thereto.

After the voltage of Vg−Vth1 has been applied to the detection line, the TFT S2 or S3 is turned off so as to charge the detection line through the sixth TFT T1 of the first subpixel. Because the voltage across the detection line is already the initial voltage, it is unnecessary to charge the detection line from 0V. Hence, it is able to increase a charging rate, thereby to detect a drift value of the threshold voltage more quickly.

After the voltage across the detection line reaches Vg−Vth2, the sixth TFT T1 is turned off, and the voltage of Vg−Vth2 is stored in the Csmp of the compensation circuit as the target voltage. During the detection, Vg−Vth2 needs to be smaller than an on-state voltage of the OLED, so as to prevent the OLED from being turned on in an unwanted manner, thereby to perform the detection stably.

Through the above procedures, it is able to acquire the desired target voltage.

At the compensation stage subsequent to the detection stage, the acquired target voltage is outputted to the external counter control register circuit, and then the external counter control register circuit calculates the compensation voltage. To be specific, the fifth TFT T5 is turned on, so as to enable the detection line to be electrically connected to the ADC. At this time, the target voltage stored in the Csmp is converted, by the ADC, into a digital signal, and then outputted to the external counter control register circuit.

Upon the receipt of the digital signal, the external counter control register circuit may calculate the drift value of the threshold voltage in accordance with Vg−Vth2 and Vg−Vth1 (Vg is already known), and store the drift value therein. In the case that the display panel is displaying an image, the corresponding compensation voltage may be applied to the subpixel of the pixel unit in accordance with the drift value, so as to compensate for the brightness of the light-emitting elements, thereby to enable the light-emitting elements of the entire display panel to emit light at a substantially identical brightness value.

It should be appreciated that, during the implementation, apart from the external counter control register circuit, any other circuit structure may also be used to calculate the compensation voltage for the pixel compensation, which will not be particularly defined herein.

According to the embodiments of the present disclosure, the display device includes the compensation circuit, and any two subpixels of each pixel unit are connected to the driver circuit through the compensation circuit. The compensation voltage for the to-be-compensated subpixel may be detected through the compensation circuit, and then the voltage applied to the to-be-compensated subpixel may be compensated with the compensation voltage. As compared with the related art where a voltage-current characteristic of the driving TFT for each subpixel is acquired through fitting and then the compensation voltage for the corresponding brightness value is calculated in accordance with the voltage-current characteristic, in the embodiments of the present disclosure, it is able to control a current flow direction through the compensation circuit and directly detect the compensation voltage, thereby to improve a brightness compensation effect for the subpixel.

Based on an identical inventive concept, the present disclosure further provides in some embodiments a pixel compensation method for use in a display device. The display device includes a display panel and a driver circuit. The display panel includes a plurality of pixel units, and any two subpixels of each pixel unit are connected to the driver circuit through a compensation circuit. The pixel compensation method includes a step of acquiring a compensation voltage of each subpixel through the compensation circuit, and compensating for a voltage applied to the subpixel in accordance with the compensation voltage.

In a possible embodiment of the present disclosure, the driver circuit includes a plurality of driving circuit, each driving circuit is configured to drive a corresponding subpixel to display, and any two subpixels of each pixel unit are connected to the corresponding two driving circuits through one compensation circuit.

In a possible embodiment of the present disclosure, all the subpixels of each pixel unit share one identical detection line. The compensation circuit includes five TFTs, an analog-digital converter and a compensation storage capacitor. Gate electrodes of the five TFTs are connected to different power sources. The five TFTs include a first TFT, a second TFT, a third TFT, a fourth TFT and a fifth TFT. Any two subpixels of each pixel unit are connected to a first driving circuit and a second driving circuit respectively. The first driving circuit is connected to a source electrode of the first TFT and a source electrode of the second TFT. A drain electrode of the first TFT is connected to a data line corresponding to one of the subpixels. The second driving circuit is connected to a source electrode of the third TFT and a source electrode of the fourth TFT, and a drain electrode of the fourth TFT is connected to a data line corresponding to the other one of the subpixels. An input end of the analog-digital converter is connected to a source electrode of the fifth TFT, a drain electrode of the fifth TFT is connected to a detection line, a drain electrode of the second TFT, a drain electrode of the third TFT and one end of the compensation storage capacitor. And an output end of the analog-digital converter is connected to an external counter control register circuit.

In a possible embodiment of the present disclosure, each subpixel includes an OLED, a pixel storage capacitor, an induction capacitor, a sixth TFT, a seventh TFT and an eighth TFT. The pixel storage capacitor is connected between a source electrode and a gate electrode of the sixth TFT, a drain electrode of the seventh TFT is connected to a data line corresponding to the subpixel, the induction capacitor is connected between a gate electrode of the eighth TFT and the ground, a drain electrode of the sixth TFT is connected to a reference voltage source, a source electrode of the sixth TFT is connected to the OLED, a gate electrode of the seventh TFT and the gate electrode of the eighth TFT are connected to different voltage sources, and a source electrode of the eighth TFT is connected to the detection line.

The pixel compensation procedure may mainly include three stages, i.e., an initial stage where an initial voltage is acquired, a detection stage where a target voltage is acquired in accordance with the initial voltage, and a compensation stage where compensation data is calculated in accordance with the target voltage and fed back to a corresponding subpixel for compensation.

In the embodiments of the present disclosure, each pixel unit includes four subpixels, two of which are connected to the driving circuits respectively through the compensation circuit. For example, two subpixels in the middle of the pixel unit may be connected to the first driving circuit and the second driving circuit through the compensation circuit respectively. In the case that the pixel compensation needs to be performed and the initial voltage and the target voltage are detected at the initial stage and the detection stage, the two subpixels connected to the driving circuits through the compensation circuit may be detected in a similar manner, while the two subpixels not connected to the driving circuits through the compensation circuit may be detected in another similar manner.

In the case that two subpixels in the middle of each pixel unit are connected to the first driving circuit and the second driving circuit through the compensation circuit respectively, the pixel compensation procedure for the subpixels of the pixel unit will be described hereinafter.

At the initial stage, the acquisition of the initial voltages is slightly different from each other for the subpixels at different positions.

To be specific, in the case that each pixel unit includes a first subpixel, a second subpixel, a third subpixel and a fourth subpixel, and the second subpixel and the third subpixel are connected to the driving circuits through the compensation circuit respectively, the initial voltage of the first subpixel may be acquired as follows.

At the initial stage, the five TFTs are turned off, and in the case that a to-be-compensated subpixel is the first subpixel, a first predetermined voltage is applied to a data line corresponding to the first subpixel through the driving circuit corresponding to the first subpixel.

Next, the second TFT is turned on so as to apply the initial voltage to the detection line through the driving circuit corresponding to the second subpixel, or the third TFT is turned on so as to apply a second predetermined voltage to the detection line through the driving circuit corresponding to the third subpixel.

Next, the first TFT and the fourth TFT are turned on, so as to apply the second predetermined voltage to the data lines corresponding to the second subpixel, the third subpixel and the fourth subpixel through the driving circuits corresponding to the second subpixel, the third subpixel and the fourth subpixel respectively.

Finally, the second TFT or the third TFT that has been turned on is turned off so as to charge the detection line through the sixth TFT of the first subpixel until a voltage across the detection line does not increase, and then the voltage across the detection line is stored in the compensation storage capacitor as the initial voltage.

In addition, in the case that each pixel unit includes the first subpixel, the second subpixel, the third subpixel and the fourth subpixel, and the second subpixel and the third subpixel are connected to the driving circuits through the compensation circuit respectively, the initial voltage of the second subpixel may be acquired as follows.

At the initial stage, the five TFTS are turned off, and in the case that the to-be-compensated subpixel is the second subpixel, the first TFT is turned on so as to apply the first predetermined voltage to the data line corresponding to the second subpixel through the driving circuit corresponding to the second subpixel.

Next, the third TFT is turned on, so as to apply the second predetermined voltage to the detection line through the driving circuit corresponding to the third subpixel.

Next, the fourth TFT is turned on, so as to apply the second predetermined voltage to the data lines corresponding to the first subpixel, the third subpixel and the fourth subpixel through the driving circuits corresponding to the first subpixel, the third subpixel and the fourth subpixel respectively.

Finally, the third TFT that has been turned on is turned off so as to charge the detection line through the first TFT of the second subpixel until the voltage across the detection line does not increase, and then the voltage across the detection line is stored in the compensation storage capacitor as the initial voltage.

In addition, in the case that each pixel unit includes the first subpixel, the second subpixel, the third subpixel and the fourth subpixel, and the second subpixel and the third subpixel are connected to the driving circuits through the compensation circuit respectively, the initial voltage of the third subpixel may be acquired as follows.

At the initial stage, the five TFTs are turned off, and in the case that the to-be-compensated subpixel is the third subpixel, the fourth TFT is turned on, so as to apply the first predetermined voltage to the data line corresponding to the third subpixel through the driving circuit corresponding to the third subpixel.

Next, the second TFT is turned on, so as to apply the second predetermined voltage to the detection line through the driving circuit corresponding to the second subpixel.

Next, the first TFT is turned on, so as to apply the second predetermined voltage to the data lines corresponding to the first subpixel, the second subpixel and the fourth subpixel through the driving circuits corresponding to the first subpixel, the second subpixel and the fourth subpixel respectively.

Finally, the second TFT that has been turned on is turned off so as to charge the detection line through the first TFT of the third subpixel until the voltage across the detection line does not increase, and then the voltage across the detection line is stored in the compensation storage capacitor as the initial voltage.

In the case that each pixel unit includes the first subpixel, the second subpixel, the third subpixel and the fourth subpixel, and the second subpixel and the third subpixel are connected to the driving circuits through the compensation circuit respectively, the initial voltage of the fourth subpixel may be acquired as follows.

At the initial stage, the five TFTs are turned off, and in the case that the to-be-compensated subpixel is the fourth subpixel, the first predetermined voltage is applied to the data line corresponding to the fourth subpixel through the driving circuit corresponding to the fourth subpixel.

Next, the second TFT is turned on so as to apply the second predetermined voltage to the detection line through the driving circuit corresponding to the second subpixel, or the third TFT is turned on so as to apply the second predetermined voltage to the detection line through the driving circuit corresponding to the third subpixel.

Next, the first TFT and the fourth TFT are turn on, so as to apply the second predetermined voltage to the data lines corresponding to the first subpixel, the second subpixel and the third subpixel through the driving circuits corresponding to the first subpixel, the second subpixel and the third subpixel respectively.

Finally, the second TFT or the third TFT is turned off so as to charge the detection line through the first TFT of the fourth subpixel until the voltage across the detection line does not increase, and then the voltage across the detection line is stored in the compensation storage capacitor as the initial voltage.

In the embodiments of the present disclosure, after the acquisition of the initial voltage, the fifth TFT may be further turned on, so as to output the initial voltage stored in the compensation storage capacitor to the external counter control register circuit through the analog-digital converter and store the initial voltage therein.

At the detection stage, based on the above acquisition of the initial voltages, the acquisition of the target voltages may be slightly different from each other for the subpixels at different positions.

To be specific, the target voltage of the first subpixel may be acquired as follows. At the detection stage, the five TFTs are turned off, and in the case that the to-be-compensated subpixel is the first subpixel, the first predetermined voltage is applied to the data line corresponding to the first subpixel through the driving circuit corresponding to the first subpixel.

Next, the second TFT is turned on so as to apply the initial voltage to the detection line through the driving circuit corresponding to the second subpixel, or the third TFT is turned on so as to apply a voltage equal to a difference between the first predetermined voltage and the initial voltage to the detection line through the driving circuit corresponding to the third subpixel.

Next, the first TFT and the fourth TFT are turned on, so as to apply the second predetermined voltage to the data lines corresponding to the second subpixel, the third subpixel and the fourth subpixel through the driving circuits corresponding to the second subpixel, the third subpixel and the fourth subpixel respectively.

Finally, the second TFT or the third TFT that has been turned on is turned off so as to charge the detection line through the sixth TFT of the first subpixel until the voltage across the detection line does not increase, and then the voltage across the detection line is stored in the compensation storage capacitor as the target voltage.

In addition, the target voltage of the second subpixel may be acquired as follows.

At the detection stage, the five TFTs are turned off, and in the case that the to-be-compensated subpixel is the second subpixel, the first TFT is turned on, such that the first predetermined voltage is applied to the data line corresponding to the second subpixel through the driving circuit corresponding to the second subpixel.

Next, the third TFT is turned on, so as to apply the initial voltage to the detection line through the driving circuit corresponding to the third subpixel.

Next, the fourth TFT is turned on, so as to apply the second predetermined voltage to the data lines corresponding to the first subpixel, the third subpixel and the fourth subpixel through the driving circuits corresponding to the first subpixel, the third subpixel and the fourth subpixel respectively.

Finally, the third TFT that has been turned on is turned off so as to charge the detection line through the sixth TFT of the second subpixel until the voltage across the detection line does not increase, and then the voltage across the detection line is stored in the compensation storage capacitor as the target voltage.

In addition, the target voltage of the third subpixel may be acquired as follows.

At the detection stage, the five TFTs are turned off, and in the case that the to-be-compensated subpixel is the third subpixel, the first predetermined voltage is applied to the data line corresponding to the third subpixel through the driving circuit corresponding to the third subpixel.

Next, the second TFT is turned on, so as to apply the initial voltage to the detection line through the driving circuit corresponding to the second subpixel.

Next, the first TFT is turned on, so as to apply the second predetermined voltage to the data lines corresponding to the first subpixel, the second subpixel and the fourth subpixel through the driving circuits corresponding to the first subpixel, the second subpixel and the fourth subpixel respectively.

Finally, the second TFT that has been turned on is turned off so as to charge the detection line through the first TFT of the third subpixel until the voltage across the detection line does not increase, and then the voltage across the detection line is stored in the compensation storage capacitor as the target voltage.

In addition, the target voltage of the fourth subpixel may be acquired as follows.

At the detection stage, the five TFTs are turned off, and in the case that the to-be-compensated subpixel is the fourth subpixel, the first predetermined voltage is applied to the data line corresponding to the fourth subpixel through the driving circuit corresponding to the fourth subpixel.

Next, the second TFT is turned on so as to apply the initial voltage to the detection line through the driving circuit corresponding to the second subpixel, or the third TFT is turned on so as to apply the initial voltage to the detection line through the driving circuit corresponding to the third subpixel.

Next, the first TFT and the fourth TFT are turn on, so as to apply the second predetermined voltage to the data lines corresponding to the first subpixel, the second subpixel and the third subpixel through the driving circuits corresponding to the first subpixel, the second subpixel and the third subpixel respectively.

Finally, the second TFT or the third TFT that has been turned on is turned off so as to charge the detection line through the first TFT of the fourth subpixel until the voltage across the detection line does not increase, and then the voltage across the detection line is stored in the compensation storage capacitor as the target voltage.

At the compensation stage, after the acquisition of the target voltage, the fifth TFT may be turned on, so as to output the target voltage stored in the pixel compensation capacitor to the external counter control register circuit through the analog-digital converter. The external counter control register circuit is configured to calculate the compensation data in accordance with the target voltage, and feed back the compensation data to the corresponding subpixel for compensation.

In a possible embodiment of the present disclosure, the driving circuit further includes a latch unit, a delay unit and a digital-analog converter. The latch unit is connected to the delay unit, the delay unit is connected to the digital-analog converter, the digital-analog converter is connected to a positive input end of an operational amplifier, and a negative input end of the operational amplifier is connected to an output end of the operational amplifier.

The implementation of the pixel compensation method is substantially similar to the implementation of the display device, and thus will not be particularly defined herein.

According to the embodiments of the present disclosure, the display device includes the compensation circuit, and any two subpixels of each pixel unit are connected to the driver circuit through the compensation circuit. The compensation voltage for the to-be-compensated subpixel may be detected through the compensation circuit, and then the voltage applied to the to-be-compensated subpixel may be compensated with the compensation voltage. As compared with the related art where a voltage-current characteristic of the driving TFT for each subpixel is acquired through fitting and then the compensation voltage for the corresponding brightness value is calculated in accordance with the voltage-current characteristic, in the embodiments of the present disclosure, it is able to control a current flow direction through the compensation circuit and directly detect the compensation voltage, thereby to improve a brightness compensation effect for the subpixel.

The above embodiments are described in a progressive manner, and the identical or similar contents in the embodiments are not repeated, i.e., each embodiment focuses on the difference from the others.

It should be appreciated that, units and steps described in the embodiments of the present disclosure may be implemented in the form of electronic hardware, or a combination of a computer program and the electronic hardware. Whether or not these functions are executed by hardware or software depends on specific applications or design constraints of the technical solution. Different methods may be adopted with respect to the specific applications so as to achieve the described functions, without departing from the scope of the present disclosure.

It should be further appreciated that, for convenience and clarification, operation procedures of the system, device and units described hereinabove may refer to the corresponding procedures in the method embodiment, and thus will not be particularly defined herein.

It should be appreciated that, the method and the device in the embodiments of the present disclosure may be implemented in any other ways. For example, the above-mentioned embodiments involving the device are merely for illustrative purposes, and the members of the device are divided merely on the basis of their logic functions. In actual use, these members may be divided in any other ways, e.g., a plurality of units or components may be combined or integrated into another system, or some features may be omitted or not executed. In addition, for the so-called "coupling", "directly coupling" or "in communication with", interfaces may be provided. In the case that the devices or units are indirectly coupled to each other or in communication with each other, they may be electrically or mechanically connected to each other, or in any other forms.

The units may be, or may not be, physically separated from each other. The units for displaying may be, or may not be, physical units, i.e., they may be arranged at an identical position, or distributed on a plurality of network elements. Parts or all of the units may be selected in accordance with the practical need, so as to achieve the purpose of the present disclosure.

In addition, the functional units in the embodiments of the present disclosure may be integrated into one processing unit, or each unit may exist independently, or two or more units may be integrated into one unit.

In the case that the functional units are implemented in a software form and sold or used as a separate product, they may be stored in a computer-readable medium. Based on this, the technical solutions of the present disclosure, partial or full, or parts of the technical solutions of the present disclosure contributing to the related art, may appear in the form of software products, which may be stored in a storage medium and include several instructions so as to enable computer equipment (a personal computer, a server or network equipment) to execute all or parts of the steps of the method according to the embodiments of the present disclosure. The storage medium includes any medium capable of storing therein program codes, e.g., a universal serial bus (USB) flash disk, a mobile hard disk (HD), a read-only memory (ROM), a random access memory (RAM), a magnetic disk or an optical disk.

Unless otherwise defined, such words as "one" or "one of" are merely used to represent the existence of at least one member, rather than to limit the number thereof. For example, such words as "a compound" or "at least one compound" may include a plurality of compounds, e.g., a mixture thereof.

The word "illustrative" merely refers to an example or instance, and any "illustrative" embodiment shall not be necessarily understood as a preferred embodiment, or being advantageous over any other embodiments, and/or excluding a combination of the features from the other embodiments.

The word "possible" refers to the feature involved in a certain embodiment is not provided in the other embodiment. Any specific embodiment of the present disclosure may include a plurality of "possible" features, in the case of no conflict.

Each embodiment in the present disclosure may be described in the form of a certain range. It should be appreciated that, the description in the form of the certain range is merely for convenience and clarification, but shall not be construed as limiting the scope of the present disclosure. Hence, the range shall be deemed as including all possible sub-ranges as well as any single value within the range, regardless of a width of the range. For example, the description "within the range of 1 to 6: shall be deemed as including such sub-ranges as "the range of 1 to 3", "the range of 1 to 4", "the range of 2 to 4", "the range of 2 to 6", "the range of 3 to 6", and any single value within the range, e.g., 1, 2, 3, 4, 5 and 6.

In the case that a specific numerical range is specified, it shall include all numbers (fractional or integral numbers) within the numerical range. Such expressions as "within the range of a first number to a second number" or "ranging from a first number to a second number" are intended to include the first number, the second number and any fractional and integral numbers between the first number and the second number.

It should be further appreciated that, for clarification, some features are separately described in several embodiments, but they may also be combined in a single embodiment. Also, the features described in a single embodiment may also be described separately, or in any appropriate combinations, in the other embodiments. Some features described in a certain embodiment shall not be deemed as necessary features for the embodiment, unless the embodiment is unfeasible without these features.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising a display panel and a driver circuit, wherein the display panel comprises a plurality of pixel units, any two subpixels of each pixel unit are connected to the driver circuit through a compensation circuit, and the driver circuit is configured to acquire a compensation voltage of each subpixel through the compensation circuit, and compensate for a voltage applied to the subpixel in accordance with the compensation voltage, wherein all the subpixels of each pixel unit share an identical detection line;

wherein the driver circuit comprises a plurality of driving circuit, each driving circuit is configured to drive a corresponding subpixel to display, and any two subpixels of each pixel unit are connected to the corresponding two driving circuits through one compensation circuit;

wherein the compensation circuit comprises five thin film transistors (TFTs), an analog-digital converter and a compensation storage capacitor;

gate electrodes of the five TFTs are connected to different power sources;

the five TFTs comprise a first TFT, a second TFT, a third TFT, a fourth TFT and a fifth TFT;

any two subpixels of each pixel unit are connected to a first driving circuit and a second driving circuit respectively;

the first driving circuit is connected to a source electrode of the first TFT and a source electrode of the second TFT, a drain electrode of the first TFT is connected to a data line corresponding to one of the subpixels, the second driving circuit is connected to a source electrode of the third TFT and a source electrode of the fourth TFT, and a drain electrode of the fourth TFT is connected to a data line corresponding to the other one of the subpixels; and an input end of the analog-digital converter is connected to a source electrode of the fifth TFT, a drain electrode of the fifth TFT is connected to a detection line, a drain electrode of the second TFT, a drain electrode of the third TFT and one end of the compensation storage capacitor, the other end of the compensation storage capacitor is grounded, and an output end of the analog-digital converter is connected to an external counter control register circuit.

2. The display device according to claim 1, wherein each subpixel comprises an organic light-emitting diode (OLED), a pixel storage capacitor, an induction capacitor, a sixth TFT, a seventh TFT and an eighth TFT; and the pixel storage capacitor is connected between a source electrode and a gate electrode of the sixth TFT, a drain electrode of the seventh TFT is connected to a data line corresponding to the subpixel, the induction capacitor is connected between a gate electrode of the eighth TFT and the ground, a drain electrode of the sixth TFT is connected to a reference voltage source, a source electrode of the sixth TFT is connected to the OLED, a gate electrode of the seventh TFT and the gate electrode of the eighth TFT are connected to different voltage sources, and a source electrode of the eighth TFT is connected to the detection line.

3. The display device according to claim 2, wherein each pixel unit comprises a first subpixel, a second subpixel, a third subpixel and a fourth subpixel, and the second subpixel and the third subpixel of each pixel unit are connected to the corresponding driving circuits through the compensation circuit, wherein the driver circuit is configured to:
at an initial stage, turn off the five TFTs, and in the case that a to-be-compensated subpixel is the first subpixel, apply a first predetermined voltage to a data line corresponding to the first subpixel through the driving circuit corresponding to the first subpixel;
turn on the second TFT so as to apply an initial voltage to the detection line through the driving circuit corresponding to the second subpixel, or turn on the third TFT so as to apply a second predetermined voltage to the detection line through the driving circuit corresponding to the third subpixel;
turn on the first TFT and the fourth TFT, and apply the second predetermined voltage to data lines corresponding to the second subpixel, the third subpixel and the fourth subpixel through the driving circuits corresponding to the second subpixel, the third subpixel and the fourth subpixel; and
turn off the second TFT or the third TFT that has been turned on so as to enable the sixth TFT of the first subpixel to charge the detection line until the voltage across the detection line does not increase, and store the voltage across of the detection line in the compensation storage capacitor as the initial voltage.

4. The display device according to claim 3, wherein the driver circuit is further configured to turn on the fifth TFT, so as to apply the initial voltage stored in the compensation storage capacitor to the external counter control register circuit through the analog-digital converter.

5. The display device according to claim 4, wherein the driver circuit is further configured to:
at a detection stage, turn off the five TFTs, and in the case that the to-be-compensated subpixel is the first subpixel, apply the first predetermined voltage to the data line corresponding to the first subpixel through the driving circuit corresponding to the first subpixel;
turn on the second TFT so as to apply the initial voltage to the detection line through the driving circuit corresponding to the second subpixel, or turn on the third TFT so as to apply a voltage equal to a difference between the first predetermined voltage and the initial voltage to the detection line through the driving circuit corresponding to the third subpixel;
turn on the first TFT and the fourth TFT so as to apply the second predetermined voltage to the data lines corresponding to the second subpixel, the third subpixel and the fourth subpixel through the driving circuits corresponding to the second subpixel, the third subpixel and the fourth subpixel; and
turn off the second TFT or the third TFT that has been turned on so as to charge the detection line through the sixth TFT of the first subpixel until the voltage across the detection line does not increase, and store the voltage across the detection line in the compensation storage capacitor as a target voltage.

6. The display device according to claim 5, wherein the driver circuit is further configured to turn on the fifth TFT so as to apply the target voltage stored in the compensation storage capacitor to the external counter control register circuit through the analog-digital converter.

7. The display device according to claim 6, wherein the driver circuit is further configured to receive the compensation voltage calculated by the external counter control register circuit, and compensate for the voltage applied to the to-be-compensated subpixel in accordance with the compensation voltage; and
the compensation voltage is calculated by the external counter control register circuit in accordance with the initial voltage and the target voltage.

8. The display device according to claim 4, wherein the driver circuit is further configured to:
at a detection stage, turn off the five TFTs, and in the case that the to-be-compensated subpixel is the second subpixel, turn on the first TFT so as to apply the first predetermined voltage to the data line corresponding to the second subpixel through the driving circuit corresponding to the second subpixel;
turn on the third TFT so as to apply the initial voltage to the detection line through the driving circuit corresponding to the third subpixel;
turn on the fourth TFT so as to apply the second predetermined voltage to the data lines corresponding to the first subpixel, the third subpixel and the fourth subpixel through the driving circuits corresponding to the first subpixel, the third subpixel and the fourth subpixel; and
turn off the third TFT that has been turned on so as to charge the detection line through the sixth TFT of the second subpixel until the voltage across the detection line does not increase, and store the voltage across the detection line in the compensation storage capacitor as a target voltage.

9. The display device according to claim 2, wherein the pixel unit comprises a first subpixel, a second subpixel, a third subpixel and a fourth subpixel, and the second subpixel and the third subpixel of each subpixel unit are connected to the corresponding driving circuits through the compensation circuit, wherein the driver circuit is configured to:
at an initial stage, turn off the five TFTs, and in the case that a to-be-compensated subpixel is the second subpixel, turn on the first TFT so as to apply a first predetermined voltage to a data line corresponding to the second subpixel through the driving circuit corresponding to the second subpixel;
turn on the third TFT so as to apply a second predetermined voltage to the detection line through the driving circuit corresponding to the third subpixel;
turn on the fourth TFT, so as to apply the second predetermined voltage to data lines corresponding to the first subpixel, the third subpixel and the fourth subpixel through the driving circuits corresponding to the first subpixel, the third subpixel and the fourth subpixel; and
turn off the third TFT that has been turned on so as to charge the detection line through the sixth TFT of the second subpixel until a voltage across the detection line does not increase, and store the voltage across the detection line in the compensation storage capacitor as an initial voltage.

10. The display device according to claim 9, wherein the driver circuit is further configured to turn on the fifth TFT, so as to apply the initial voltage stored in the compensation storage capacitor to the external counter control register circuit through the analog-digital converter.

11. The display device according to claim 4, wherein the driver circuit is further configured to:

at a detection stage, turn off the five TFTs, and in the case that the to-be-compensated subpixel is the first subpixel, apply the first predetermined voltage to the data line corresponding to the first subpixel through the driving circuit corresponding to the first subpixel;

turn on the second TFT so as to apply the initial voltage to the detection line through the driving circuit corresponding to the second subpixel, or turn on the third TFT so as to apply a voltage equal to a difference between the first predetermined voltage and the initial voltage to the detection line through the driving circuit corresponding to the third subpixel;

turn on the first TFT and the fourth TFT so as to apply the second predetermined voltage to the data lines corresponding to the second subpixel, the third subpixel and the fourth subpixel through the driving circuits corresponding to the second subpixel, the third subpixel and the fourth subpixel; and turn off the second TFT or the third TFT that has been turned on so as to charge the detection line through the sixth TFT of the first subpixel until the voltage across the detection line does not increase, and store the voltage across the detection line in the compensation storage capacitor as a target voltage.

12. The display device according to claim 11, wherein the driver circuit is further configured to turn on the fifth TFT so as to apply the target voltage stored in the compensation storage capacitor to the external counter control register circuit through the analog-digital converter.

13. The display device according to claim 12, wherein the driver circuit is further configured to receive the compensation voltage calculated by the external counter control register circuit, and compensate for the voltage applied to the to-be-compensated subpixel in accordance with the compensation voltage; and the compensation voltage is calculated by the external counter control register circuit in accordance with the initial voltage and the target voltage.

14. The display device according to claim 10, wherein the driver circuit is further configured to:

at a detection stage, turn off the five TFTs, and in the case that the to-be-compensated subpixel is the second subpixel, turn on the first TFT so as to apply the first predetermined voltage to the data line corresponding to the second subpixel through the driving circuit corresponding to the second subpixel;

turn on the third TFT so as to apply the initial voltage to the detection line through the driving circuit corresponding to the third subpixel;

turn on the fourth TFT so as to apply the second predetermined voltage to the data lines corresponding to the first subpixel, the third subpixel and the fourth subpixel through the driving circuits corresponding to the first subpixel, the third subpixel and the fourth subpixel; and turn off the third TFT that has been turned on so as to charge the detection line through the sixth TFT of the second subpixel until the voltage across the detection line does not increase, and store the voltage across the detection line in the compensation storage capacitor as a target voltage.

15. A pixel compensation method for use in a display device, wherein the display device comprises a display panel and a driver circuit, the display panel comprises a plurality of pixel units, and any two subpixels of each pixel unit are connected to the driver circuit through a compensation circuit, wherein the pixel compensation method comprises:
acquiring a compensation voltage of each subpixel through the compensation circuit,
compensating for a voltage applied to the subpixel in accordance with the compensation voltage,
wherein all the subpixels of each pixel unit share an identical detection line;
wherein the driver circuit comprises a plurality of driving circuit, each driving circuit is configured to drive a corresponding subpixel to display, and any two subpixels of each pixel unit are connected to the corresponding two driving circuits through one compensation circuit;
wherein the compensation circuit comprises five thin film transistors (TFTs), an analog-digital converter and a compensation storage capacitor;
gate electrodes of the five TFTs are connected to different power sources;
the five TFTs comprise a first TFT, a second TFT, a third TFT, a fourth TFT and a fifth TFT;
any two subpixels of each pixel unit are connected to a first driving circuit and a second driving circuit respectively;
the first driving circuit is connected to a source electrode of the first TFT and a source electrode of the second TFT, a drain electrode of the first TFT is connected to a data line corresponding to one of the subpixels, the second driving circuit is connected to a source electrode of the third TFT and a source electrode of the fourth TFT, and a drain electrode of the fourth TFT is connected to a data line corresponding to the other one of the subpixels; and
an input end of the analog-digital converter is connected to a source electrode of the fifth TFT, a drain electrode of the fifth TFT is connected to a detection line, a drain electrode of the second TFT, a drain electrode of the third TFT and one end of the compensation storage capacitor, the other end of the compensation storage capacitor is grounded, and an output end of the analog-digital converter is connected to an external counter control register circuit.

16. The pixel compensation method according to claim 15, wherein each subpixel comprises an organic light-emitting diode (OLED), a pixel storage capacitor, an induction capacitor, a sixth TFT, a seventh TFT and an eighth TFT; and the pixel storage capacitor is connected between a source electrode and a gate electrode of the sixth TFT, a drain electrode of the seventh TFT is connected to a data line corresponding to the subpixel, the induction capacitor is connected between a gate electrode of the eighth TFT and the ground, a drain electrode of the sixth TFT is connected to a reference voltage source, a source electrode of the sixth TFT is connected to the OLED, a gate electrode of the seventh TFT and the gate electrode of the eighth TFT are connected to different voltage sources, and a source electrode of the eighth TFT is connected to the detection line.

* * * * *